United States Patent
Cyman, Jr. et al.

(10) Patent No.: US 10,342,136 B2
(45) Date of Patent: Jul. 2, 2019

(54) MONITORING DEVICE

(71) Applicant: R.R. DONNELLEY & SONS COMPANY, Chicago, IL (US)

(72) Inventors: Theodore F. Cyman, Jr., Grand Island, NY (US); Alan R. Murzynowski, Grand Island, NY (US); Daniel E. Kanfoush, Grand Island, NY (US)

(73) Assignee: R.R. Donnelley & Sons Company, Chicago, IL (US)

( * ) Notice: Subject to any disclaimer, the term of this patent is extended or adjusted under 35 U.S.C. 154(b) by 0 days.

(21) Appl. No.: 15/711,689

(22) Filed: Sep. 21, 2017

(65) Prior Publication Data

US 2018/0092216 A1    Mar. 29, 2018

Related U.S. Application Data

(60) Provisional application No. 62/399,026, filed on Sep. 23, 2016.

(51) Int. Cl.
*H05K 1/18*    (2006.01)
*H05K 1/11*    (2006.01)
*G06K 19/077*  (2006.01)

(52) U.S. Cl.
CPC ......... *H05K 1/185* (2013.01); *G06K 19/0772* (2013.01); *G06K 19/07749* (2013.01); *H05K 1/11* (2013.01); *H05K 2201/10037* (2013.01)

(58) Field of Classification Search
USPC ................................................ 361/761, 760
See application file for complete search history.

(56) References Cited

U.S. PATENT DOCUMENTS

| | | | |
|---|---|---|---|
| 4,012,552 | A | 3/1977 | Watts |
| 4,368,281 | A | 1/1983 | Brummett et al. |
| 4,515,653 | A | 5/1985 | Furubayashi et al. |
| 4,632,879 | A | 12/1986 | Tanaka et al. |
| 5,581,065 | A | 12/1996 | Nishikawa et al. |
| 5,790,020 | A | 8/1998 | Sasagawa et al. |
| 5,802,015 | A | 9/1998 | Rothschild et al. |
| 6,019,865 | A | 2/2000 | Palmer et al. |
| 6,043,745 | A | 3/2000 | Lake |
| 6,420,096 | B1 | 7/2002 | Löbl et al. |
| 6,421,013 | B1 | 7/2002 | Chung |

(Continued)

FOREIGN PATENT DOCUMENTS

| | | |
|---|---|---|
| EP | 1019715 | 7/2000 |
| FR | 2 997 218 A1 | 4/2014 |

(Continued)

OTHER PUBLICATIONS

International Search Report and Written Opinion dated Aug. 23, 2018, for International Application No. PCT/US2018/035403, Applicant, R.R. Donnelley & Sons Company (15 pages).

(Continued)

*Primary Examiner* — Andargie M Aychillhum
(74) *Attorney, Agent, or Firm* — McCracken & Gillen LLC

(57) ABSTRACT

A monitoring device includes a substrate having a circuit trace disposed thereon and a circuit carrier having a recessed portion. The substrate includes a flexible flange portion having a component disposed thereon. The substrate is disposed on the circuit carrier such that the flange portion and the component are disposed in the recessed portion.

15 Claims, 8 Drawing Sheets

(56) References Cited

U.S. PATENT DOCUMENTS

| | | |
|---|---|---|
| 6,544,864 B2 | 4/2003 | Reeder et al. |
| 6,853,087 B2 | 2/2005 | Neuhaus et al. |
| 6,886,745 B2 | 5/2005 | Berrube et al. |
| 6,888,509 B2 | 5/2005 | Atherton |
| 6,924,781 B1 | 8/2005 | Gelbman |
| 7,042,357 B2 | 5/2006 | Girvin et al. |
| 7,057,495 B2 | 6/2006 | Debord et al. |
| 7,168,626 B2 | 1/2007 | Lerch et al. |
| 7,174,277 B2 | 2/2007 | Vock et al. |
| 7,204,425 B2 | 4/2007 | Mosher, Jr. et al. |
| 7,283,054 B2 | 10/2007 | Girvin et al. |
| 7,295,115 B2 | 11/2007 | Aljadeff et al. |
| 7,316,358 B2 | 1/2008 | Kotik et al. |
| 7,323,360 B2 | 1/2008 | Gonzalez et al. |
| 7,377,447 B2 | 5/2008 | Oberle |
| 7,417,541 B2 | 8/2008 | Lerch et al. |
| 7,586,412 B2 | 9/2009 | Takatama |
| 7,627,451 B2 | 12/2009 | Vock et al. |
| 7,639,135 B2 | 12/2009 | Arms et al. |
| 7,737,839 B1 | 6/2010 | Jones |
| 7,802,222 B2 | 9/2010 | Arsintescu |
| 7,856,339 B2 | 12/2010 | Vock et al. |
| 7,895,739 B2 | 3/2011 | Niklas et al. |
| 7,945,320 B2 | 5/2011 | Durand |
| 7,993,055 B2 | 8/2011 | Nurse et al. |
| 8,126,675 B2 | 2/2012 | Vock et al. |
| 8,203,446 B2 | 6/2012 | Tsubota et al. |
| 8,219,466 B2 | 7/2012 | Gui et al. |
| 8,280,682 B2 | 10/2012 | Vock et al. |
| 8,317,084 B2 | 11/2012 | Bagai |
| 8,354,927 B2 | 1/2013 | Breed |
| 8,428,904 B2 | 4/2013 | Vock et al. |
| 8,590,799 B2 | 11/2013 | Liu |
| 8,618,914 B2 | 12/2013 | Bachman et al. |
| 8,640,259 B2 | 1/2014 | Jung et al. |
| 8,747,775 B2 | 6/2014 | Sandvick |
| 8,762,212 B2 | 6/2014 | Falls et al. |
| 8,870,083 B2 | 10/2014 | Myers et al. |
| 8,914,090 B2 | 12/2014 | Jain et al. |
| 9,030,724 B2 | 5/2015 | Agrawal et al. |
| 9,047,437 B2 | 6/2015 | Chen et al. |
| 9,077,183 B2 | 7/2015 | Thomas et al. |
| 9,087,318 B1 | 7/2015 | Cordes et al. |
| 9,495,498 B2 | 11/2016 | Bartley et al. |
| 9,514,432 B2 | 12/2016 | Cyman, Jr. et al. |
| 10,089,594 B2 | 10/2018 | Gray |
| 2004/0066296 A1 | 4/2004 | Atherton |
| 2006/0061454 A1* | 3/2006 | Debord ............... G01K 3/005 340/309.16 |
| 2010/0176950 A1 | 7/2010 | Bartholf et al. |
| 2011/0131854 A1 | 6/2011 | Waltersdorf |
| 2012/0038461 A1 | 2/2012 | Forster |
| 2012/0071742 A1 | 3/2012 | Medina et al. |
| 2012/0162945 A1 | 6/2012 | Schreiner |
| 2014/0196847 A1 | 7/2014 | Bergherm |
| 2015/0079697 A1 | 3/2015 | Belbruno et al. |
| 2016/0050762 A1 | 2/2016 | Cyman, Jr. et al. |
| 2016/0148899 A1 | 5/2016 | Ichimura |
| 2016/0249840 A1 | 9/2016 | Pesantez et al. |
| 2017/0053235 A1 | 2/2017 | Cyman, Jr. et al. |
| 2017/0076642 A1 | 3/2017 | Cyman, Jr. et al. |
| 2017/0138922 A1 | 5/2017 | Potyrailo et al. |
| 2017/0191953 A1 | 7/2017 | Rigas |
| 2017/0229000 A1 | 8/2017 | Law |
| 2017/0354372 A1 | 12/2017 | Varadan et al. |

FOREIGN PATENT DOCUMENTS

| | | |
|---|---|---|
| JP | 2003-277653 | 10/2003 |
| JP | 2011-151259 | 8/2011 |
| WO | WO 00/73082 | 12/2000 |
| WO | WO 03/006736 | 1/2003 |
| WO | WO 2015/160830 | 10/2005 |
| WO | WO 2014/067578 | 5/2014 |
| WO | WO 2015/004830 | 1/2015 |

OTHER PUBLICATIONS

U.S. Appl. No. 14/996,413, R.R. Donnelley & Sons Company.
U.S. Appl. No. 15/043,885, R.R. Donnelley & Sons Company.
U.S. Appl. No. 15/398,510, R.R. Donnelley & Sons Company.
U.S. Appl. No. 15/451,036, R.R. Donnelley & Sons Company.
Duck, A., Dispensing SMD Adhesives: Rotary Pump Technology vs. Stencil Printing Technology, Electronic Packaging and Production, Aug. 1, 1996, pp. 41-44, vol. 36, No. 9, Cahners Publishing Co, Newton Massachusetts, U.S. (4 pages).

* cited by examiner

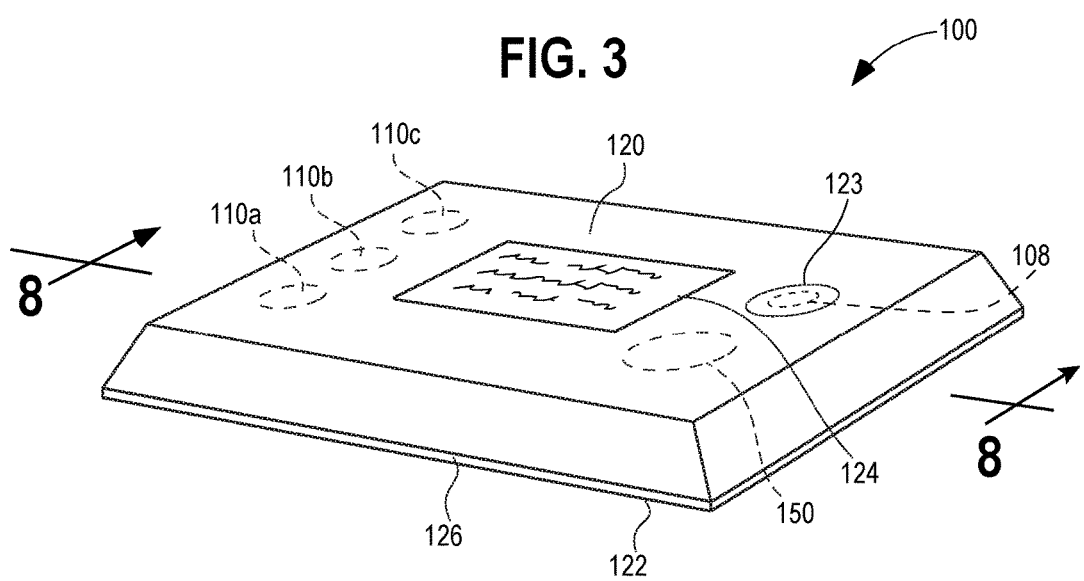

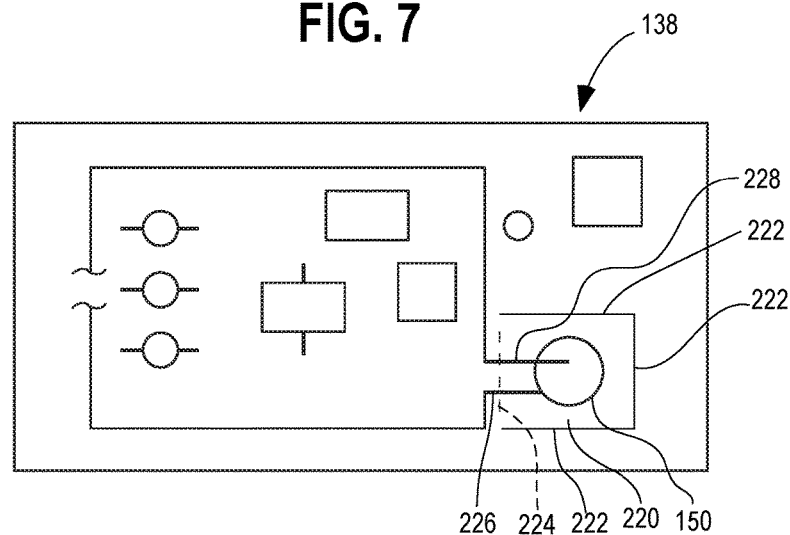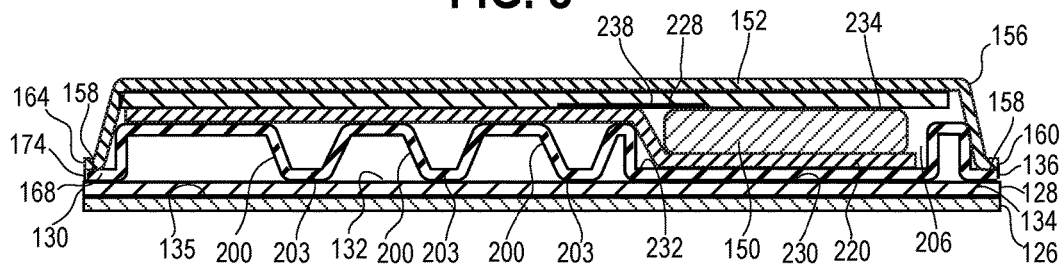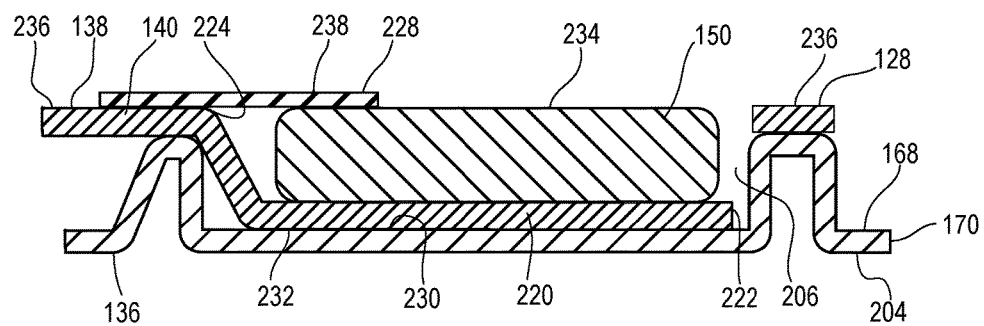

MONITORING DEVICE

CROSS REFERENCE TO RELATED APPLICATION

This present application claims the benefit of Cyman, Jr., U.S. Provisional Patent Application Ser. No. 62/399,026, filed Sep. 23, 2016, entitled "Monitoring Device and a Method of Constructing a Monitoring Device". The entire contents of this application are incorporated herein by reference.

FIELD OF DISCLOSURE

The present subject matter relates to an electronic monitoring device, and more particularly a device for monitoring an environment.

BACKGROUND

An object may be exposed to one or more ambient environmental conditions that can damage or otherwise adversely affect the object. A party, such as an owner or other having an interest in the object, may wish to determine whether the object was so exposed. Some goods may be particularly susceptible to damage from external forces or environmental extremes. For example, glassware, electronic instruments, mechanical parts, and the like may be damaged if dropped or subjected to excessive acceleration. Similarly, electronics, liquids, and pharmaceuticals may be harmed if exposed to temperatures and/or humidity outside of predetermined ranges.

Further, damage to a good may not be apparent simply by inspecting the good. Exposure to forces or extremes in temperature may not cause visually perceptible changes, but may affect the operating characteristics, effectiveness, and/or longevity of the good. For example, the effectiveness of a pharmaceutical or an electronic component may be altered if exposed to extreme temperatures. Similarly, electronic boards in a device may become unseated from connectors if such device is subjected to excessive acceleration, as may occur from being dropped or jostled.

In addition, when a customer reports to a seller that the good was already damaged upon receipt by the customer, it may be difficult to ascertain when such damage occurred, and who is accountable for such damage. In particular, it may be difficult to confirm whether the damage to the good occurred when the object was in storage before sale, in transit, or after the recipient received the good.

Monitoring devices have been developed that can track the progress of a good during shipment and/or environmental conditions to which such good is exposed. Such monitoring devices typically include a processor, memory, one or more sensors, a Radio Frequency Identification (RFID) transceiver, and a battery. Such a device may include an accelerometer to measure any forces acting on the device, or an environmental sensor that measures, for example, the temperature and/or humidity in the environment surrounding the device. Such a device may be affixed to a good to be shipped or placed in an environment to be monitored, and the processor in the device periodically polls the one or more sensors to acquire therefrom measurements associated with forces acting on the device (and therefore the good) and/or the environmental conditions to which the device (and therefore the good) is exposed. The processor then records such measurements and a timestamp of when such measurement was acquired in the memory associated with the RFID transceiver. An RFID reading device may later be used to read a log of measurements associated with the forces and environmental conditions encountered by the monitoring device. Such log may be analyzed to determine if the good encountered extraordinary forces and/or environmental conditions.

In the monitoring device described above, the processor is powered and becomes active periodically to poll the sensors in the device. In some monitoring devices the processor may actuate an indicator periodically that indicates whether monitoring device is active and/or whether the monitoring device has been exposed to an unacceptable environmental condition. If the processor and or indicator are activated over a long period of time, the monitoring device may require a battery with sufficient capacity. However, a battery that has sufficient capacity may be bulky and the device may need to include features that accommodate such battery.

SUMMARY

According to one aspect, a monitoring device includes a substrate having a circuit trace disposed thereon and a circuit carrier. The substrate includes a flexible flange portion having a component disposed thereon and the circuit carrier includes a recessed portion. The substrate is disposed on the circuit carrier such that the flange portion and the component are disposed in the recessed portion.

BRIEF DESCRIPTION OF THE DRAWINGS

FIG. 3 is an isometric view of the monitoring device of FIGS. 1, 2A, and 2B;

FIG. 7 is a top planar view of a substrate, and a circuit disposed thereon, of the monitoring device of FIGS. 1, 2A, and 2B;

FIG. 8 is a sectional view taken generally along the lines 8-8 of FIG. 3;

FIG. 9 is a magnified sectional view taken generally along the line 8-8 of FIG. 3, with portions not shown for clarity;

DETAILED DESCRIPTION

A monitoring device as disclosed herein monitors the environment of an object at least at a particular point in time, and more preferably, over a period of time. The monitoring device includes a processor, memory, at least one sensor, a radio frequency identification (RFID) transceiver and/or other communication device(s) (wired or wireless), one or more actuators, and optionally one or more indicators. The monitoring device includes one or more sensors that can measure, for example, the presence of airborne pollutants and/or odors, the temperature and/or the humidity in the ambient environment surrounding the device, acceleration to which the monitoring device is subjected, and the like. Such a device may be affixed or placed on a surface (e.g., an interior surface of a room or vehicle, an interior of a package, exterior surface of a package, etc.) and activated using the one or more actuators. The processor in the device periodically polls the sensor(s) to acquire measurements therefrom associated with one or more ambient condition(s). The processor records in the memory such measurements and a timestamp of when each such measurement was acquired to create a log. In addition, the processor may evaluate such measurement to determine if the monitoring device has been subjected to an environmental condition or action that is outside an acceptable range. The processor may actuate the one or more indicators to indicate the result of such evaluation. Further, data stored in the memory may be transferred from the memory of the monitoring device via the RFID transceiver or other communication device(s) to another processor for reporting and/or additional processing.

Figure 1:
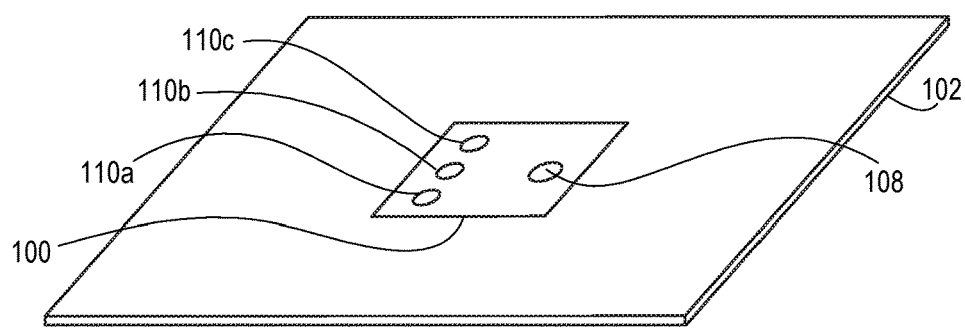
FIG. 1 is an isometric view of a monitoring device disposed on a surface in accordance with the present disclosure.
Figure 2A:
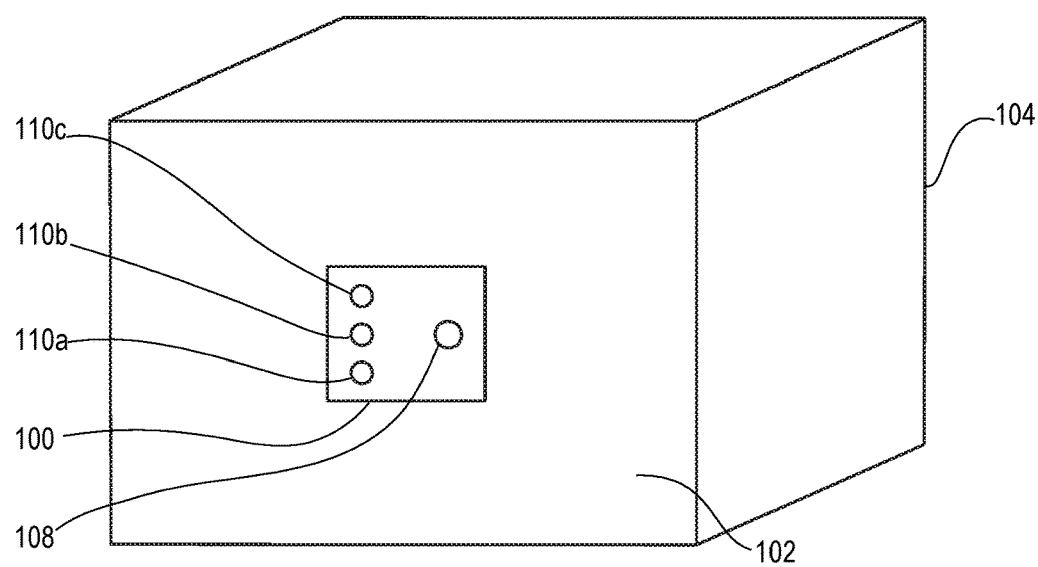
FIG. 2A is an isometric view of a monitoring device disposed on an outer surface of an object in accordance with the present disclosure.
Figure 2B:
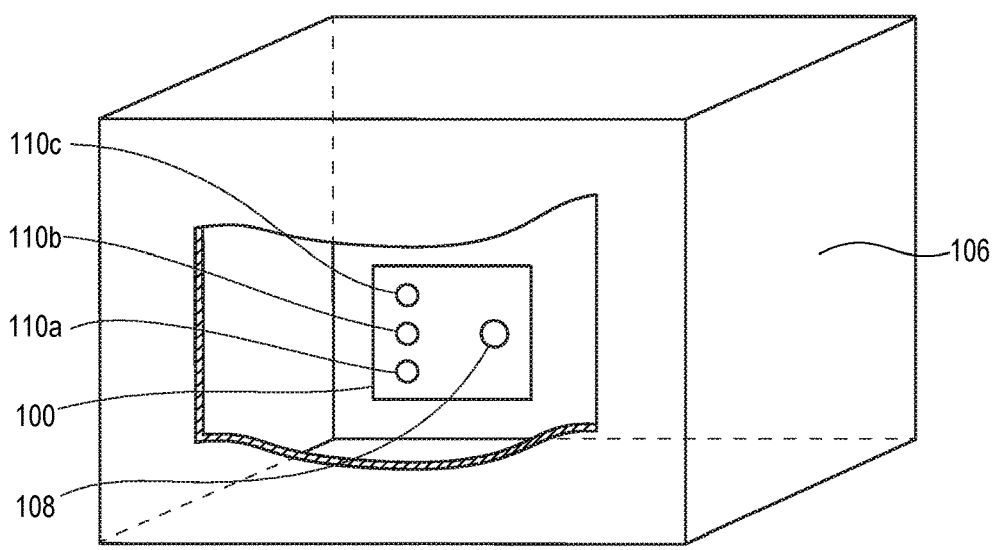
FIG. 2B is an isometric view of a monitoring device disposed on an inner surface of an object in accordance with the present disclosure.

More specifically, referring to FIGS. 1, 2A, and 2B, a monitoring device 100 is disposed on a surface 102. The monitoring device 100 may be temporarily placed on the surface 102 or the monitoring device 100 may be affixed to the surface 102. The surface 102 may be, for example, an outer surface 102 (FIG. 2A) of an object 104, an inner surface 102 (FIG. 2B) of an object 106, or any other portion thereof. It should be noted that the object may be a vehicle, a package, a room or other environment, a finished or an unfinished good or goods, whether packaged or not, or any other article or articles. As described below, the monitoring device 100 may be configured to store data regarding exposure of the device 100, and therefore the surface 102, to one or more ambient influences or a lack of such exposure at one or more points in time in a memory of the device 102 or in another device (whether local or remote from the device 102). The ambient influence(s) may include an environmental condition, a force, disposition of the object 100 in one or more particular orientations, or any other influence that can be detected as noted in greater detail hereinafter.

The monitoring device 100 includes an actuator 108 that when actuated directs the processor to begin collecting data regarding the ambient influence(s) to which the monitoring device 100 is exposed, and recording such data in the memory of the monitoring device 100. The monitoring device 100 also includes one or more indicator(s) 110 that may be actuated by the processor to indicate whether the monitoring device 100, and therefore the surface 102, has been exposed to an ambient influence and, in some cases, the degree or amount of such influence.

Specific embodiments comprehend the use of analog and/or digital sensors, together with any associated necessary or desirable conditioning and/or interface circuits that are used together with the processor to develop one or more indications of exposure by the monitoring device 100 to ambient influences (possibly, dependent upon package contents). Such indications may be developed at one or more points in time, in accordance with ambient influences such as, but not limited to, exposure to a material (including particulates and/or other solids, or liquids), biological agent (s), odorants, orientation, temperature, humidity, movement, vibration, acceleration, pressure, nuclear and/or electromagnetic radiation (including visible and invisible light, x-rays, alpha, beta, or gamma rays), magnetic fields, first and higher degrees of rate of change of any one or more parameters or conditions, first and higher degrees of integration of one or more parameters or conditions, and/or the like, and combinations thereof. The monitoring device 100 may also include one or more sensors that detect whether the monitoring device 100 has been tampered with and/or otherwise altered.

The magnitude of one or more sensed parameters could be stored, whether at a single time, at multiple discrete times, or continuously over one or more periods of time. Alternatively, or in addition, a different condition may be detected, as indicated by one or more other parameters exceeding or falling below a threshold, and the condition may be detected a single time or multiple times. In the latter case, the detection may occur at discrete times or may occur continuously over one or more periods of time.

Referring to FIG. 3, the monitoring device 100 includes a substantially planar top surface 120 and a substantially planar bottom surface 122. The actuator 108 may be actuated by the user from the top surface, for example by pressing on a portion 123 of the top surface 120 associated with such actuator 108. Visible on the top surface 120 may be one or more indicia 124, and at least a portion of any light emitted by the visual indicators 110.

In some embodiments, the bottom surface 122 comprises a removable liner 126.

Figure 4:
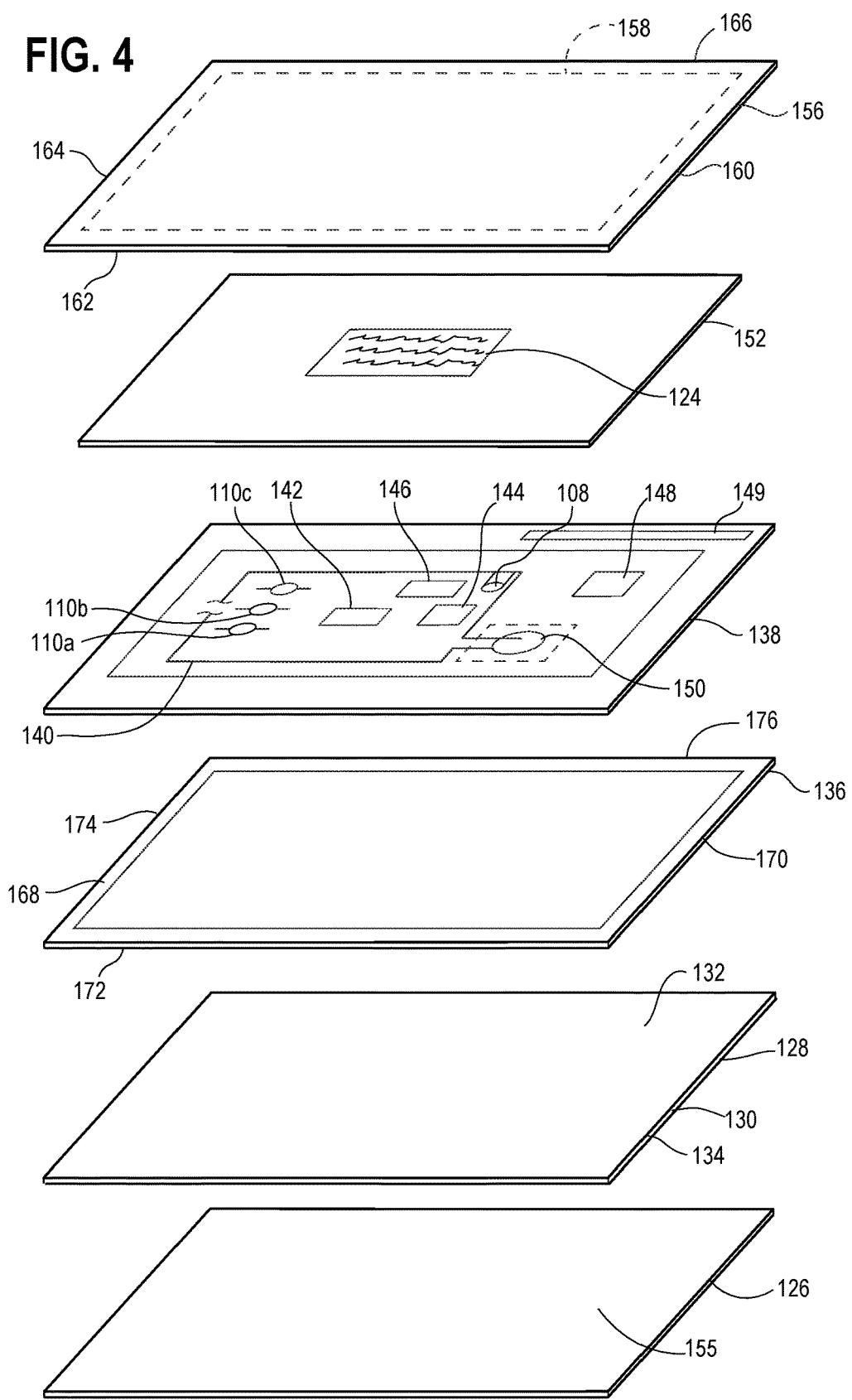
FIG. 4 is an isometric exploded view of the monitoring device of FIGS. 1, 2A, and 2B.

Referring also to FIG. 4, when the removable line 126 is in place, the removable liner 126 is affixed to an adhesive layer 128. In some embodiments, the adhesive layer 128 includes a substrate 130 having adhesive material disposed on a top surface 132 and a bottom surface 134 thereof. The top surface 135 of the removable liner 126 is coated with a gloss material so that such top surface 135 may be detached from the adhesive material on the bottom surface 134 of the adhesive layer 128 without substantially removing or damaging such adhesive material. After the removable liner 126 is removed, the adhesive material on the bottom surface 134 is exposed and may be used to secure the monitoring device 100 to the surface 102 (FIG. 1).

The adhesive material on the top surface 132 of the adhesive layer 128 secures the adhesive layer 128 to a circuit carrier 136. Disposed on the circuit carrier 136 is a substrate 138 having one or more circuit trace(s) 140 disposed thereon. The circuit traces(s) 140 interconnect components disposed on the circuit trace(s) 140 and/or the substrate 138. Such components include one or more actuator(s) 108, one or more indicator(s) 110, a processor 142, a memory 144 associated with the processor 142, a sensor 146, an RFID transceiver 148, an antenna 149 used by the RFID transceiver 149, and a battery 150.

A card 152 is disposed on top of the substrate 138. The card 152 may be printed with the indicia 124 that is visible on the top surface 120 of the monitoring device 100. Further, the material for the card 152 is selected so that at least a portion of the light emitted by the indicators 110 will be visible through the card 152. In some embodiments, the card 152 may include at least a portion that is relatively transparent or translucent. In some cases, the card 152 may be entirely translucent or transparent. Alternately, the card 152 may have apertures (not shown) aligned with such indicators 110 to allow light emitted thereby to pass through. In some embodiments, a portion of the card 152 corresponding to an indicator 110 may be tinted so that any if such indicator 110 emits white light, the color of the light after transmission through the card will be perceived as having such tint. Different portions of the card 152 associated with different indicators 110 may be tinted with different colors.

A protective covering 156 is disposed on top of the card 152. In some embodiments the protective covering 156 is substantially transparent so that the indicia 124 printed on the card 152 and/or the light emitted by the indicators 110 is visible therethrough. In a preferred embodiment, the circuit carrier 136 and the protective covering 156 are larger than the substrate 138 and the card 152, so that a portion 158 of the protective covering 156 proximate the edges 160, 162, 164, and 166 thereof is brought into contact with and affixed to a corresponding portion 168 of the circuit carrier 136 proximate the edges 170, 172, 174, and 176 thereof.

Affixing the protective covering 156 to the circuit carrier 136 as described above sandwiches (or encases) the substrate 138 and the card 152 therebetween and prevents movement thereof when the monitoring device 100 is used.

Figure 5:
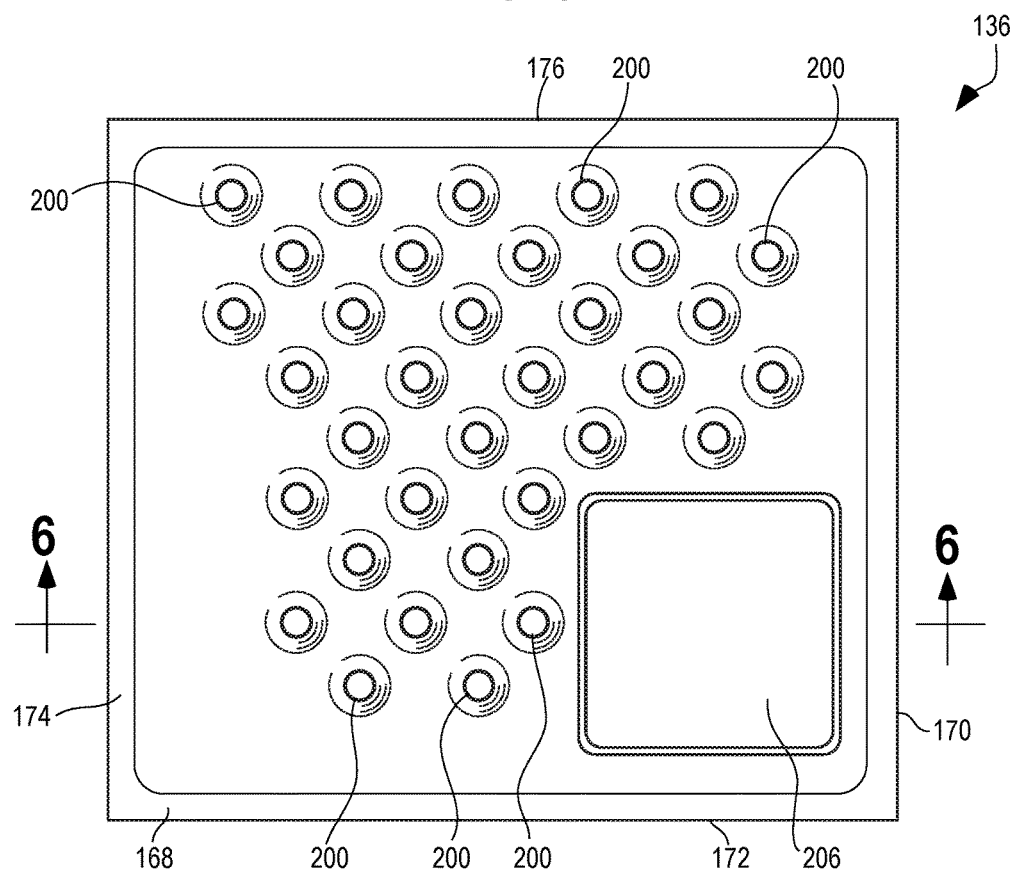
FIG. 5 is a top planar view of a circuit carrier of the monitoring device of FIGS. 1, 2A, and 2B.
Figure 6:
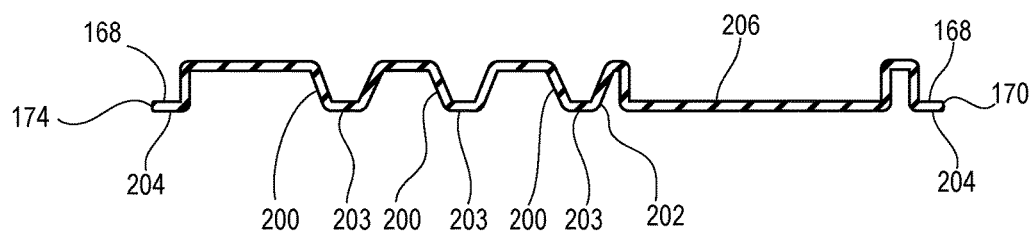
FIG. 6 is a sectional view taken generally along the lines 6-6 of FIG. 5.
Figure 10A:
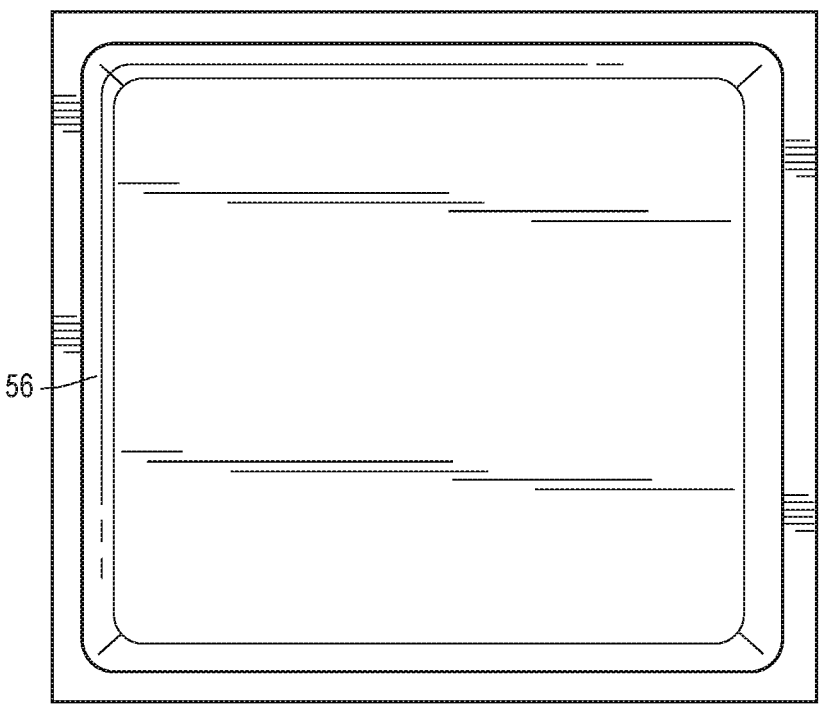
FIGS. 10a-10d are planar views of components that comprise the monitoring device of FIGS. 1, 2A, and 2B.
Figure 10B:
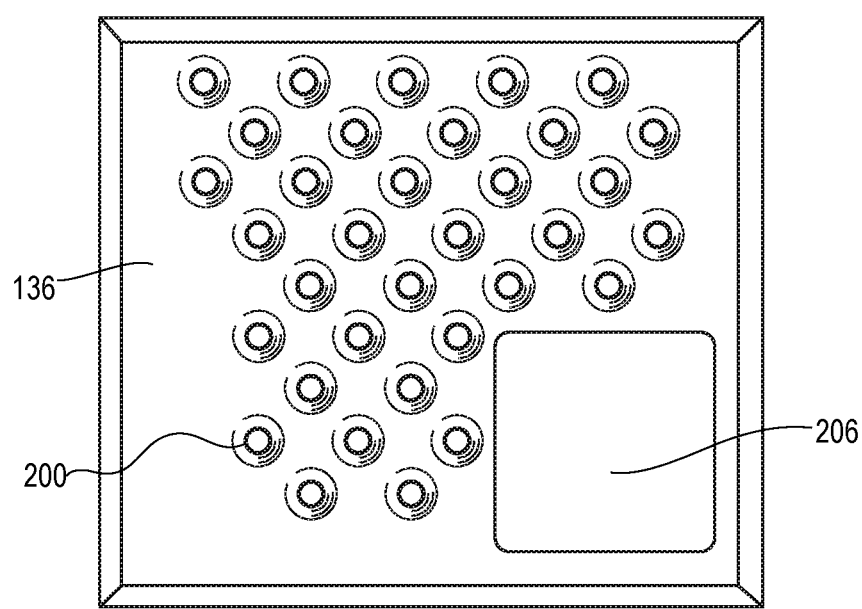
Figure 10C:
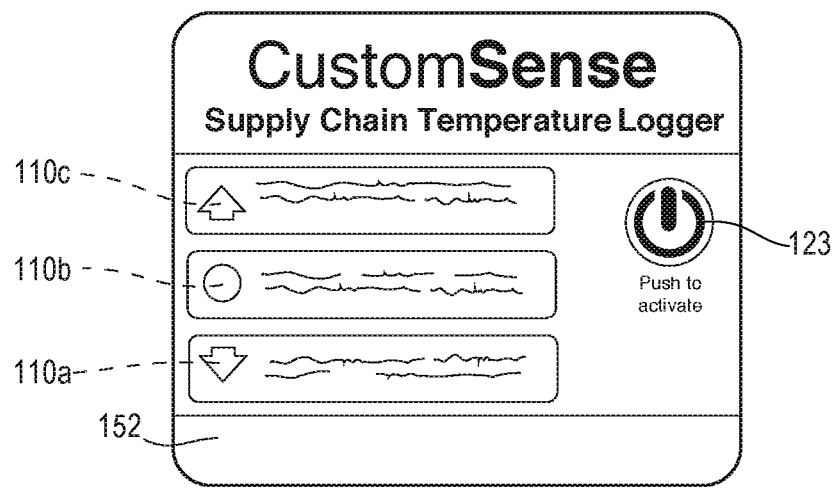
Figure 10D:
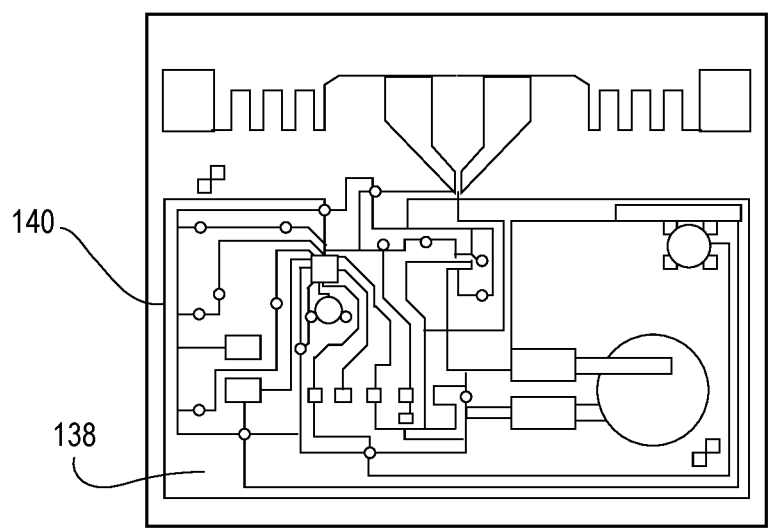

Referring to FIGS. 5 and 6, the circuit carrier 136 is manufactured from a substantially rigid material such as plastic, plastic foam, a vinyl, polyvinyl chloride, polystyrene, and the like. The circuit carrier 136 includes a plurality of protrusions 200 that protrude outwardly from a bottom portion 202 thereof. In some embodiments, each protrusion 200 is frustum shaped and includes a flat portion 203 to which the top surface 132 of the adhesive layer 128 may be affixed. In addition, such top surface 132 may be affixed to a bottom surface 204 of the portion 168 that surrounds the circuit carrier 136. The protrusions 200 provide physical space between the circuit disposed on the substrate 138 and the surface 102 (FIG. 1) on which the monitoring device 100 is disposed.

The circuit carrier 136 also includes a recess 206 into which the battery 150 may be disposed, as described below.

Referring to FIG. 7, the substrate 138 on which the circuit traces 140 and associated components are disposed includes a flange portion 220 on which the battery 150 is disposed. The flange portion 220 is formed by cutting one or more slits 222 through the substrate 138 that partially surround the battery 150, leaving a connected portion 224 that provides a living hinge about which the flange portion 220 can be moved relative to the plane of the substrate 138. Further, connectors 226 and 228 of the conductive trace 140 that electrically couple the battery 150 to the rest of the circuit 140 are disposed on the connected portion 224. In some embodiments, the battery 150 is a coin cell battery such as, for example, a CR2032 type battery. Other types of batteries appropriate to the application for which monitoring device 100 is to be used may be used.

Referring to FIGS. 8 and 9, when the substrate 138 is disposed on the circuit carrier 136, the flange portion 220 bends along the connected portion 224, so that a bottom surface 230 of the flange portion 220 on which the battery 150 is disposed rests on a surface 232 of the recess 206 of the substrate 138. In one embodiment, the depth of the recess 206 is such that when the battery 150 is disposed in the recess 206, a top surface 234 of the battery 150 does not substantially extend outwardly beyond a top surface 236 of the substrate 138 that is disposed on a portion of the circuit carrier 136 other than the recess 206. In other embodiments, the depth of the recess 206 is such that when the battery 150 is disposed therein, a top surface 238 of the connector 228 that couples the top surface 234 of the battery 150 to the circuit 140 does not extend beyond the top surface 236. In some embodiments, the connector 228 that couples the top surface 234 of the battery 150 to the circuit 140 may be a thin flexible conductive tab. Such tab is manufactured to be sufficiently thin that the tab does not protrude substantially from the surface of the substrate 138 on which the circuit 140 is disposed.

Figure 11:
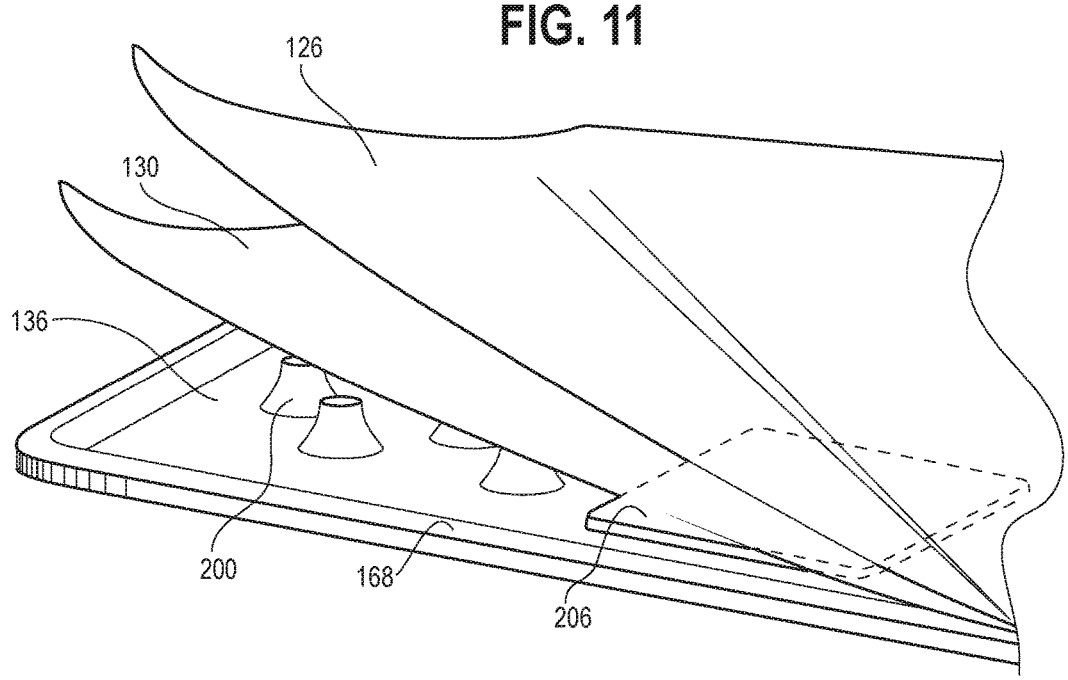
FIG. 11 is an isometric view to illustrate an arrangement of the components that comprise the monitoring device of FIGS. 1, 2A, and 2B.

FIGS. 10a-10d are planar views of the protective covering 156, the circuit carrier 136, the information card 152, and the substrate 138 having the circuit 140 disposed thereon, respectively. Referring to FIG. 11, as described above, the substrate 130 having adhesive material disposed thereon is affixed to the circuit carrier, and the removable liner 126 is affixed to the substrate 130.

Because the top surface 234 of the battery 150 and the top surface 238 of the connector 228 do not substantially extend outwardly beyond the top surface 236 of the substrate 138, the battery 150 and the connector 228 do not deform or otherwise damage the card 152 placed on top of the substrate 138 and held in place between protective covering 156 and the circuit carrier 136. Referring also to FIG. 1, thus the monitoring device 100 has a substantially planar top surface 120.

Because the card 152 is not deformed by the battery 150 and/or other elements of the circuit 140 disposed on the substrate 138, the indicia 124 printed on the card may be readily seen through the protective covering 156. Further, because the card 152 remains substantially planar (i.e., flat), air gaps do not develop between the protective covering 152 and the card that could compromise the ability of the protective covering 152 and the circuit carrier 136, when sealed, to prevent movement of the card. Further, having a substantially planar top surface 120 of the monitoring device 100 facilitates stacking of such devices one on top of one another when not in use.

In one embodiment, the protective covering 156 and the circuit carrier 136 is manufactured from a moldable, water resistant material such as, for example, a thermoform plastic. Further, the portion 158 of the protective covering 156 may be secured to the portion 168 of the circuit carrier 136 using, for example, a water resistant adhesive, a sonic weld, and the like so that water, or any other fluid, does not readily penetrate the space between the protective covering 156 and the circuit carrier 136. The monitoring device 100 constructed in this manner may be sufficiently impermeable to liquids to protect the electrical components and the circuit traces 140 disposed on the substrate 138 when the monitoring device 100 is submerged in a liquid such as, for example, water. Such a monitoring device 100 may be sufficiently water and dust resistant to satisfy or exceed water and dust ingress ratings established by, for example, National Electrical Manufacturers Association or the International Electrotechnical Commission.

Although the embodiment disclosed above describes forming a flange portion 220 that carries a battery 150 and allows the battery 150 to be disposed into a recess 206 of the circuit carrier 136, it should be apparent that other components that may otherwise protrude away from the circuit may be carried by such a flange portion and disposed into the carrier. Such additional components may include for example, a processor, an audio speaker, an light emitting device, a heat sink, and the like. Further it should be apparent that the substrate 138 may include a plurality of flange portions 220, each of which carrying one or more components. The circuit carrier 136 may include a plurality of recesses 206, and each of the plurality of flange portions 220 may be disposed in a corresponding one of the plurality of recesses 206. Although, the flange portion 220 in FIG. 7 is shown as being substantially rectangular, it should be apparent that such flange portion 220 may be any shape as appropriate for the component carried thereby.

INDUSTRIAL APPLICABILITY

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A monitoring device, comprising:
   a substrate having a circuit trace disposed thereon, wherein the substrate includes a flexible flange portion including a living hinge and wherein the flexible flange portion has a component disposed thereon; and
   a circuit carrier that includes a recessed portion;
   wherein the substrate is disposed on the circuit carrier such that the flange portion and the component are disposed in the recessed portion.

2. The monitoring device of claim 1, further including a protective covering disposed on top of the substrate and an actuator disposed on the substrate, wherein the actuator may be manually actuated through the protective covering.

3. The monitoring device of claim 2, wherein the protective covering includes first edge portions, the circuit carrier includes second edge portions, and the first edge portions are affixed to the second edge portions.

4. The monitoring device of claim 3, wherein the protective covering and the circuit carrier are affixed to one another such that the interior of the monitoring device is substantially impermeable to liquids.

5. The monitoring device of claim 3, wherein the protective covering and the circuit carrier encase the substrate.

6. The monitoring device of claim 1, wherein the substrate comprises a first substrate and further including a second substrate, wherein the second substrate includes indicia on a surface thereof, the second substrate is disposed between the substrate and the protective covering, and the indicia are visible through the protective covering.

7. The monitoring device of claim 1, wherein the circuit carrier includes a plurality of protrusions that protrude outwardly away from the substrate.

8. The monitoring device of claim 7, wherein each of the plurality of protrusions is frustum shaped and includes a flat portion.

9. The monitoring device of claim 8, wherein the substrate comprises a first substrate and further including an adhesive and a second substrate, wherein the adhesive secures the second substrate to the flat portion of at least one of the protrusions.

10. The monitoring device of claim 1, wherein the component is a battery.

11. The monitoring device of claim 1, wherein the substrate includes a top surface opposite a bottom surface, and the component includes a top surface opposite a bottom surface, wherein a portion of the bottom surface of the substrate contacts the circuit carrier, a bottom surface of the component contacts the flange, and the top surface of the component does not substantially extend outwardly from the top surface of the substrate.

12. The monitoring device of claim 11, further including a connector that electrically couples the top surface of the component with the circuit trace.

13. The monitoring device of claim 12, wherein a portion of the connector is disposed over the flange and includes a top surface opposite a bottom surface, the bottom surface of such portion of the connector is in contact with the top surface of the component, and a top surface of such portion of the connector does not substantially extend outwardly beyond the top surface of the substrate.

14. The monitoring device of claim 1, wherein the flange portion is defined by a plurality of slits cut through the substrate and partially surrounds the component disposed on the flange portion.

15. The monitoring device of claim 14, further including a hinge that connects the flange portion to the substrate.

* * * * *